(12) United States Patent
Aoyagi

(10) Patent No.: US 6,884,938 B2
(45) Date of Patent: Apr. 26, 2005

(54) COMPACT CIRCUIT MODULE

(75) Inventor: Toru Aoyagi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/706,064

(22) Filed: Nov. 12, 2003

(65) Prior Publication Data

US 2004/0194993 A1 Oct. 7, 2004

(30) Foreign Application Priority Data

Nov. 14, 2002 (JP) ........................................ 2002-331157

(51) Int. Cl.$^7$ .............................................. H05K 9/00
(52) U.S. Cl. ..................... 174/35 R; 174/52.4; 361/791; 361/790; 361/816
(58) Field of Search .................. 361/790, 791, 361/816, 818; 174/35 R, 52.4

(56) References Cited

U.S. PATENT DOCUMENTS

| | | | | |
|---|---|---|---|---|
| 4,539,622 A | * | 9/1985 | Akasaki ...................... | 361/764 |
| 4,843,188 A | * | 6/1989 | Patterson et al. .......... | 174/52.4 |
| 5,157,588 A | * | 10/1992 | Kim et al. ................... | 361/736 |
| 5,237,204 A | * | 8/1993 | Val ............................. | 257/698 |
| 5,307,240 A | * | 4/1994 | McMahon .................. | 361/728 |
| 5,652,466 A | * | 7/1997 | Hirakawa et al. ........... | 257/772 |
| 5,766,975 A | * | 6/1998 | Templeton et al. ......... | 438/107 |

FOREIGN PATENT DOCUMENTS

| | | |
|---|---|---|
| JP | 05-090438 | 4/1993 |
| JP | 09-186510 | 7/1997 |

* cited by examiner

*Primary Examiner*—Hung V. Ngo
(74) *Attorney, Agent, or Firm*—Brinks Hofer Gilson & Lione

(57) ABSTRACT

A circuit module includes an insulating base including a first wiring pattern and a cavity; at least one first electrical component disposed in the cavity; and a lid including a second wiring pattern. The insulating base includes a circuit board composed of laminated substrates and a sidewall protruding from the board surface of the circuit board and forming the cavity together with the circuit board, and the lid has at least one second electrical component fixed thereto. Also, in a state in which the second electrical component is located in the cavity, the lid is fixed on the upper surface of the sidewall so as to cover the cavity, and the first and second wiring patterns are connected to each other with at least one connecting conductor.

69 Claims, 5 Drawing Sheets

COMPACT CIRCUIT MODULE

This application claims the benefit of Japanese Patent Application No. 2002-331157, filed on Nov. 14, 2002, which is incorporated herein by reference.

BACKGROUND OF THE INVENTION

1. Field of the Invention

The present invention relates to a compact circuit module suitable for use in an electronic device such as a transmitter-receiver.

2. Description of the Related Art

As shown in FIG. 8, a known circuit module (for example, see Japanese Unexamined Patent Application Publication No. 9-186510) has a structure in which a tabular circuit board 51 composed of a multilayer substrate has a variety of electrical components 52 mounted thereon.

Such a circuit module is dimensionally large in the plane of the circuit board and also requires a box-shaped cover (not shown) composed of a metal plate for electrically shielding the electrical components 52.

The known circuit module has problems in that it is dimensionally large and expensive because of the tabular circuit board 51 structure on which the electrical components 52 are mounted and a box-shaped cover composed of a metal plate being needed for electrically shielding the electrical components 52.

SUMMARY OF THE INVENTION

Accordingly, an advantage of the present invention is to provide a circuit module which is dimensionally small in the plane of a circuit board and inexpensive.

As a first solution for the above problems, a circuit module according to the present invention includes an electrically insulating base including a first wiring pattern and a cavity; at least one first electrical component disposed in the cavity; and a lid formed so as to cover the cavity and including a second wiring pattern. The insulating base includes a circuit board composed of laminated substrates and a sidewall protruding from the board surface of the circuit board and forming the cavity together with the circuit board, and the lid has at least one second electrical component fixed thereto. Also, the second electrical component is located in the cavity when the lid is fixed on the upper surface of the sidewall so as to cover the cavity, and the first and second wiring patterns are connected to each other with at least one connecting conductor.

With this structure, the first and second electrical components are separately disposed on the insulating base and the lid, respectively, thereby achieving a circuit module which is dimensionally small.

When the insulating base and the lid have a conductive film or the like disposed around the outer peripheral surfaces thereof, an electrically shielded structure is obtained, thereby eliminating a cover composed of a metal plate, and thus achieving a less-expensive and highly-producible circuit module.

As a second solution for the above problems, the sidewall has the at least one connecting conductor disposed therein, thereby easily connecting the first wiring pattern on the insulating base and the second wiring pattern on the lid, and thus achieving a highly-producible circuit module.

As a third solution for the above problems, the insulating base has a partitioning wall disposed therein, partitioning the inside of the cavity, and the partitioning wall has the at least one connecting conductor disposed therein, thereby allowing the first and second wiring patterns to have more connecting junctions disposed therebetween, and thus achieving a circuit module with which a electrical connections between the lid and the circuit board of the insulating base are easy to design and manufacture especially in the middle part of the insulating base and of the lid.

As a fourth solution for the above problems, the lid is composed of a multilayer substrate, thereby increasing the density of a circuit of the lid and thus achieving a compact circuit module.

As a fifth solution for the above problems, the lid is composed of a low-temperature calcined ceramic, thereby achieving a readily manufactured circuit module.

As a sixth solution for the above problems, the lid has mutually facing electrodes disposed on the inner and outer surfaces thereof so as to form a capacitor, thereby achieving a compact and easily tuned circuit module.

As a seventh solution for the above problems, the lid is formed of a metal plate and an insulating film fixed to the metal plate, and the insulating film has the second wiring pattern disposed thereon and at least one second electrical component fixed thereto, thereby making the lid thin and allowing the insulating film to be reliably attached thereto.

As an eighth solution for the above problems, the insulating base is composed of a low-temperature calcined ceramic, thereby achieving a readily manufactured circuit module.

As a ninth solution the above problems, the sidewall is formed in an enclosing manner and is bonded to the lid with an adhesive so that the cavity is hermetically sealed, thereby achieving a circuit module which is reliably resistant to dust and moisture, and thus delivers excellent performance for a long period.

DESCRIPTION OF THE PREFERRED EMBODIMENTS

The accompanying drawings illustrating circuit modules according to the present invention will be briefly described.

Figure 1:
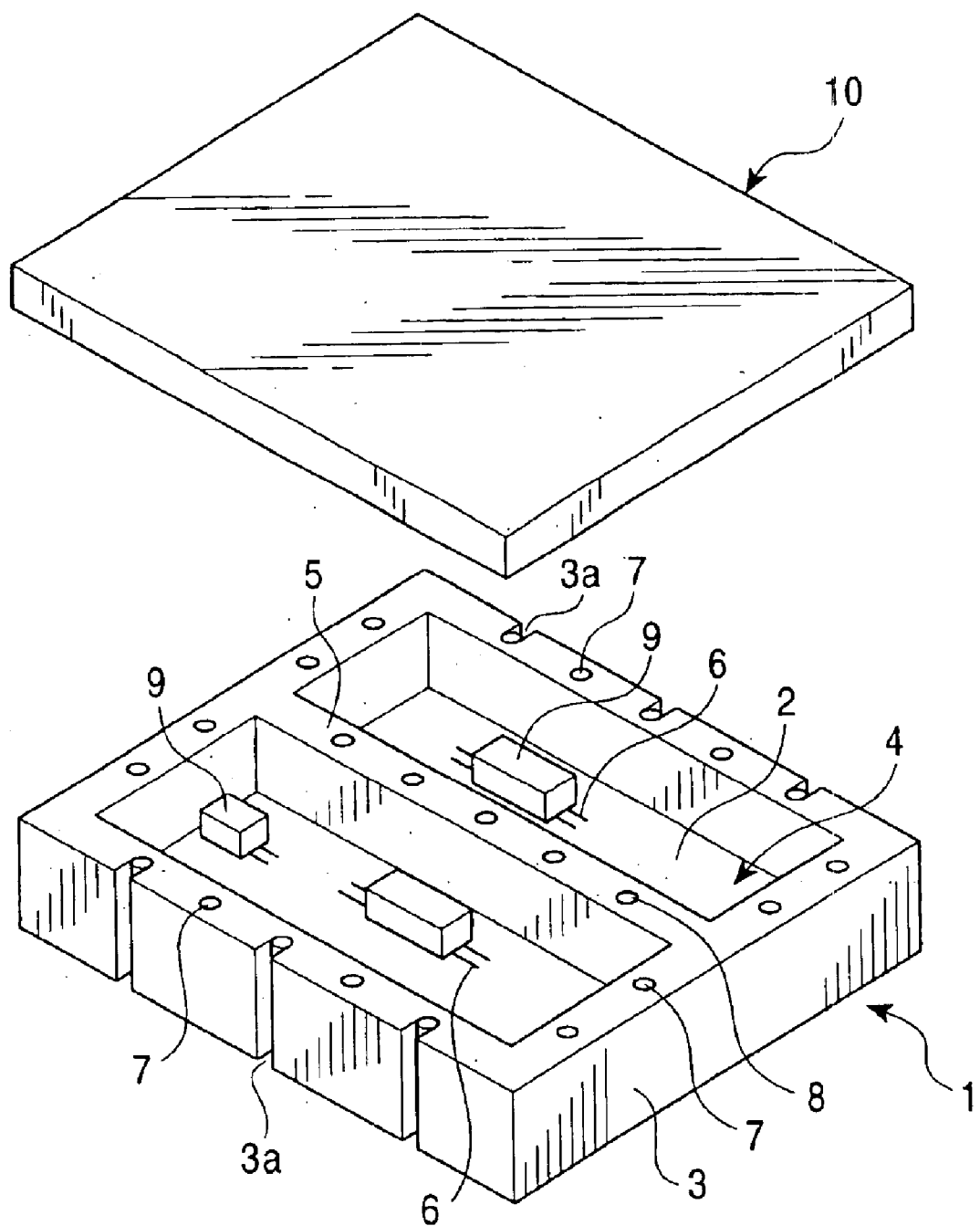
FIG. 1 is an exploded perspective view of a circuit module according to a first embodiment of the present invention.
Figure 2:
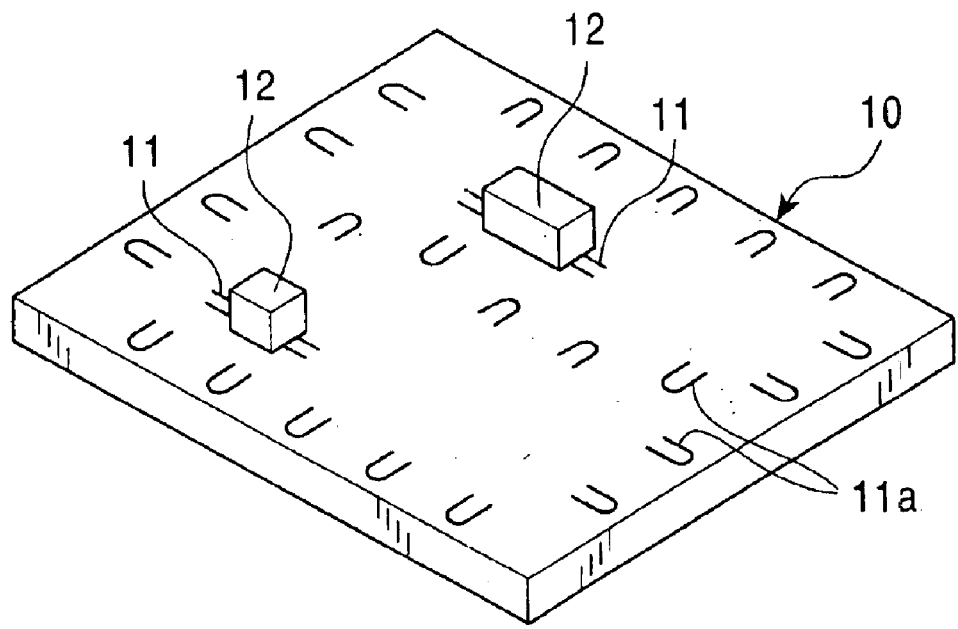
FIG. 2 is a perspective view illustrating a state in which a lid of the circuit module according to the first embodiment is turned upside down.
Figure 3:
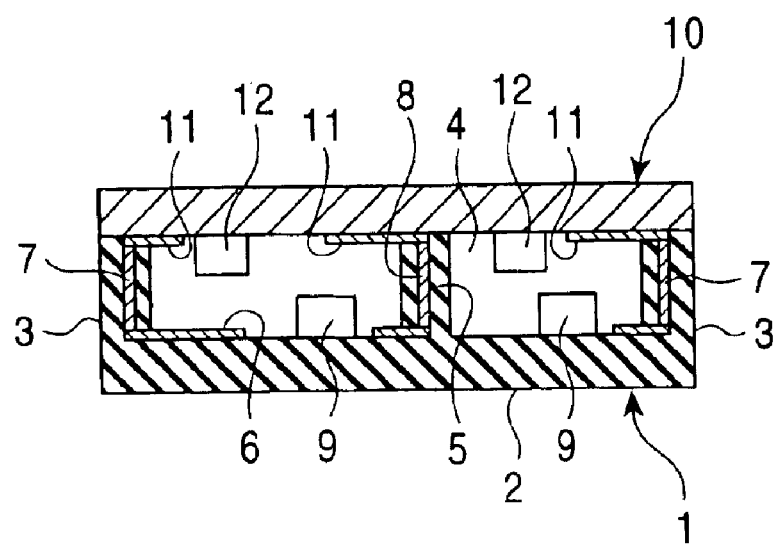
FIG. 3 is a sectional view of a major part of the circuit module according to the first embodiment.

FIG. 1 is an exploded perspective view of a circuit module according to a first embodiment, FIG. 2 is a perspective view illustrating a state in which a lid of the circuit module according to the first embodiment is turned upside down, and FIG. 3 is a sectional view of a major part of the circuit module according to the first embodiment.

Figure 4:
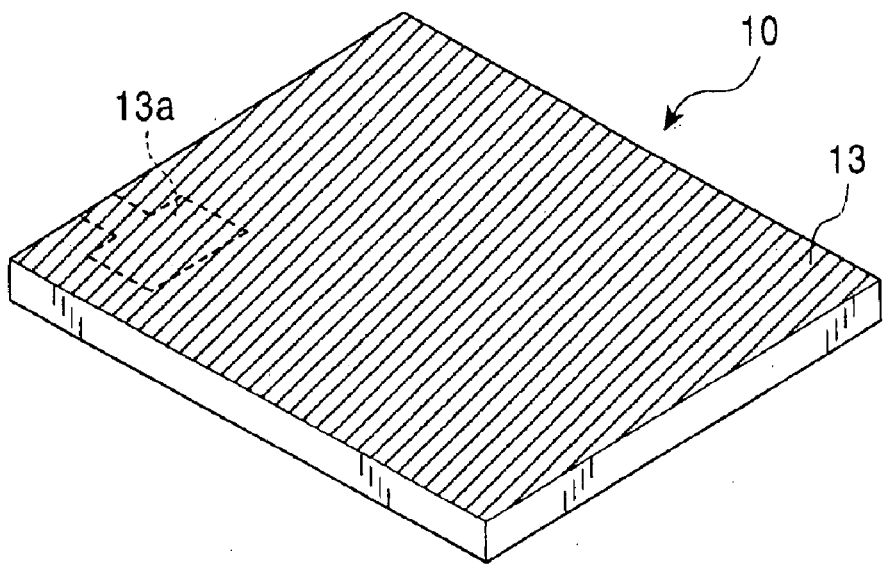
FIG. 4 is a perspective view illustrating a lid of a circuit module according to a second embodiment of the present invention.
Figure 5:
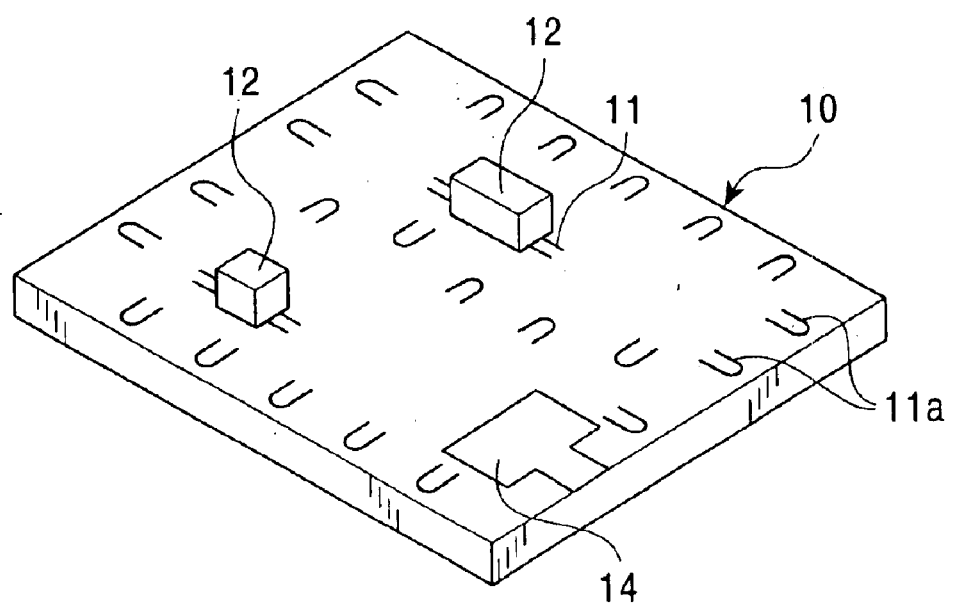
FIG. 5 is a perspective view illustrating a state in which the lid of the circuit module according to the second embodiment is turned upside down.
Figure 6:
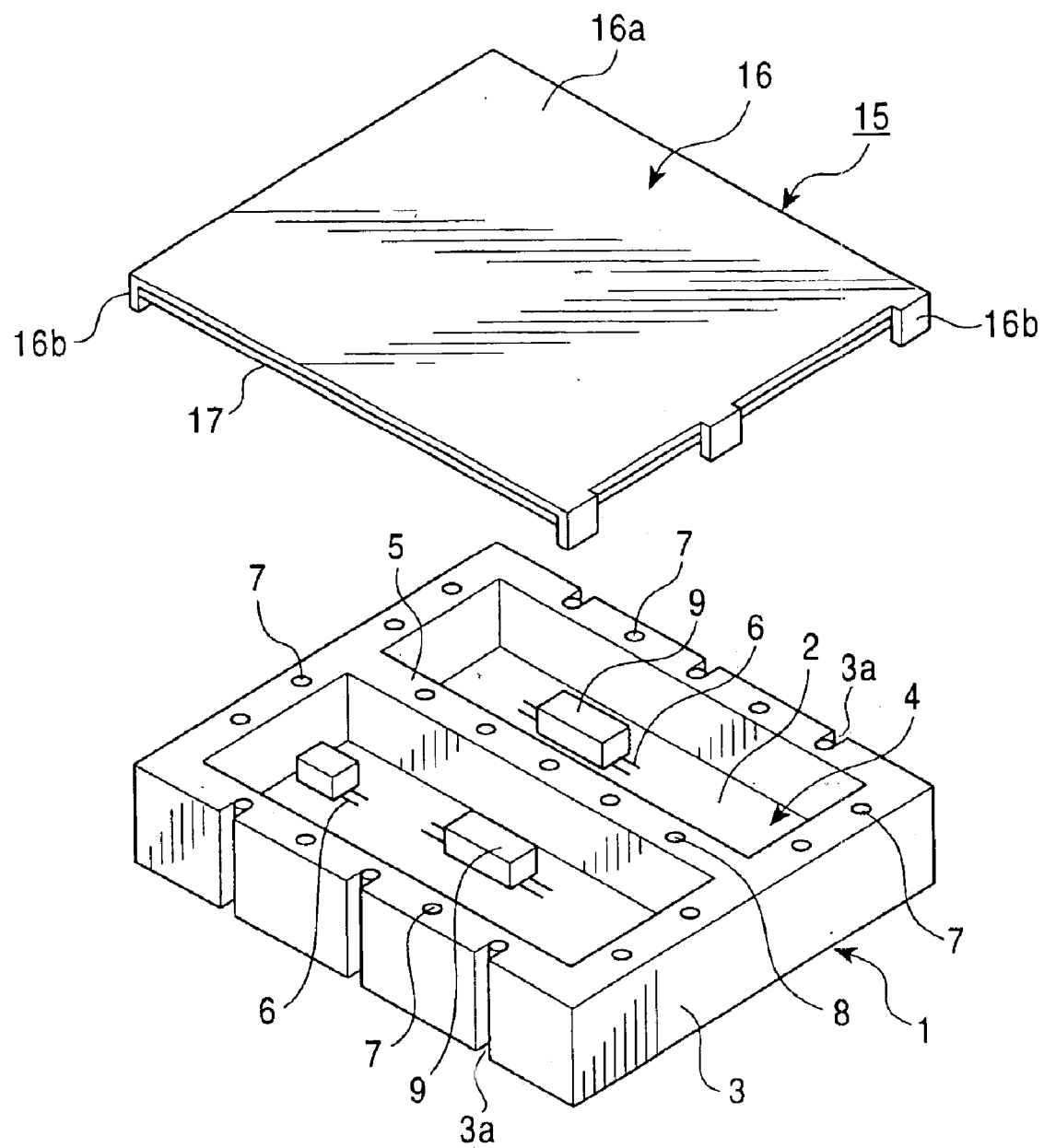
FIG. 6 is an exploded perspective view of a circuit module according to a third embodiment of the present invention.
Figure 7:
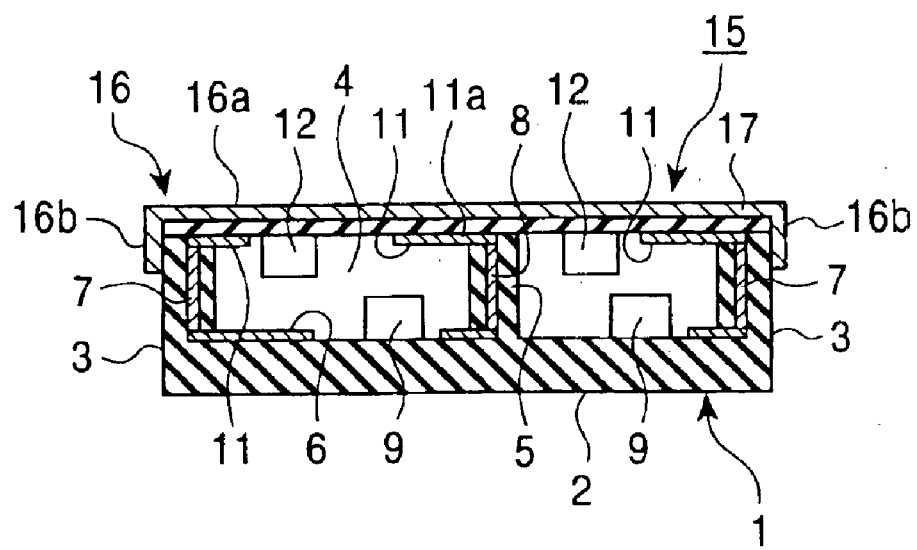
FIG. 7 is a sectional view of a major part of the circuit module according to the third embodiment.
Figure 8:
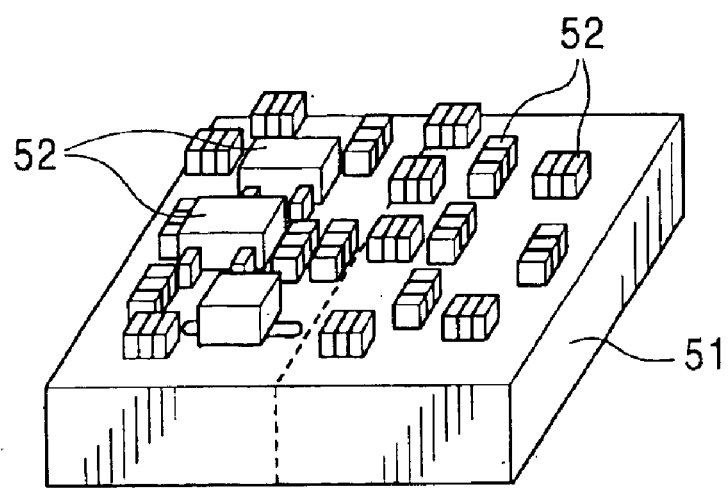
FIG. 8 is a perspective view of a known circuit module.

FIG. 4 is a perspective view illustrating a lid of a circuit module according to a second embodiment of the present invention, and FIG. 5 is a perspective view illustrating a state in which the lid of the circuit module according to the second embodiment is turned upside down. FIG. 6 is an exploded perspective view of a circuit module according to a third embodiment of the present invention, and FIG. 7 is a sectional view of a major part of the circuit module according to the third embodiment.

The structure of the circuit module according to the first embodiment of the present invention will be described with reference to FIGS. 1 to 3. An insulating base 1 which may be a laminate of a low-temperature calcined ceramic (LTCC) has a circuit board 2 composed of a multilayer substrate, a sidewall 3 formed in an enclosing manner so as to be continuous along the sidewall periphery and protruding from the board surface of the circuit board 2, a cavity 4 formed by the circuit board 2 and the sidewall 3, and a partitioning wall 5 may partition the inside of the cavity 4 creating more than one cavity.

Each of the circuit board 2, the sidewall 3, and the partitioning wall 5 may be formed by laminating a plurality of sheets of a low-temperature calcined ceramic.

The circuit board 2 has a first conductive wiring pattern 6 formed therein and also on the front surface thereof lying in the cavity 4. The sidewall 3 and the partitioning wall 5 respectively have connecting conductors 7 and connecting conductors 8 formed therein and having an electrical connection with the first wiring pattern 6.

The connecting conductors 7 and 8 extend to the upper surfaces of the side wall 3 and the partitioning wall 5, and are formed by, for example, filling a conductive paste in holes perforated in the sidewall 3 and the partitioning wall 5, respectively.

A part of the connecting conductors 7 are electrically connected to corresponding side electrodes (not shown) at cuts 3a formed in the sidewall 3 so as to be connected to a mother board.

Connecting conductors 7 and 8 may be disposed along the inner surfaces of the sidewall 3 and the partitioning wall 5 of the insulating base 1, respectively.

The circuit board 2 has a variety of first electrical components 9 mounted thereon, which are connected to the first wiring pattern 6 on the circuit board 2 in a state in which they are placed in the cavity 4.

A tabular lid 10 may be a laminate of a low-temperature calcined ceramic and has a second wiring pattern 11 formed on the lower surface thereof, including a plurality of lands 11a, and also a variety of second electrical components 12 mounted on the same.

In an assembly state in which the second electrical components 12 are located in the cavity 4, the lid 10 is disposed on the upper surfaces of the sidewall 3 and the partitioning wall 5 so as to cover the cavity 4 and is fixed to the insulating base 1 by bonding it to the sidewall 3 such as with an adhesive (not shown) along the entire peripheries thereof.

When the lid 10 is fixed to the insulating base 1, the inside of the cavity 4 may be hermetically sealed with a bonding material, which may be an adhesive, whereby a desired electrical circuit (for example, a transmitting-receiving circuit) is constructed such that the connecting conductors 7, 8 formed in the insulating base 1 are electrically connected to the corresponding lands 11a formed on the lid 10 so as to connect the first and second wiring patterns 6 and 11 to each other.

Meanwhile, the insulating base 1 and the lid 10 may have a conductive film or a conductive layer formed around the outer peripheral surfaces thereof so as to electrically shield the electrical circuit constructed in the cavity 4.

The structure of the circuit module according to the second embodiment of the present invention will be described with reference to FIGS. 4 to 5. The lid 10 has a grounding conductive layer 13 and an electrode 14 facing the conductive layer 13, respectively formed on the upper and lower surfaces thereof. The electrode 14 and an electrode 13a serving as a part of the conductive layer 13 and facing the electrode 14 form a capacitor.

The capacity of the capacitor can be tuned by removing part of the electrode 13a.

Since the remaining structure of the circuit module according to the second embodiment is the same as in the first embodiment, the same components are identified by the same reference numerals, and their description is omitted.

The structure of the circuit module according to the third embodiment of the present invention will be described with reference to FIGS. 6 to 7. A lid 15 is composed of a thin metal plate 16 and a tabular insulating film 17 fixed to the metal plate 16 with an adhesive or the like.

The metal plate 16 has a tabular portion 16a and a plurality of bent portions 16b extending approximately orthogonal from the tabular portion 16a in a bent manner, and the insulating film 17 is fixed on the lower surface of the tabular portion 16a.

The lid 15 has the second wiring pattern 11 having the lands 11a in the same fashion as in the first embodiment and the second electrical components 12, both fixed on the lower surface of the insulating film 17.

When the circuit module is assembled such that the second electrical components 12 are located in the cavity 4, the insulating film 17 is disposed on the upper surfaces of the sidewall 3 and the partitioning wall 5 so as to cover the cavity 4, and the lid 15 is fixed to the insulating base 1 by, for example, soldering the bent portions 16b to the outer peripheral surface of the insulating base 1.

In this arrangement, a desired electrical circuit (for example, a transmitting-receiving circuit) is constructed such that the lands 11a formed on the insulating film 17 are electrically connected to the corresponding connecting conductors 7,8 formed in the insulating base 1 so as to connect the first and second wiring patterns 6 and 11 to each other.

The inside of the cavity 4 may be hermetically sealed by bonding the lid 15 and the sidewall 3 along the entire peripheries thereof with an adhesive (not shown) or other material.

Since the remaining structure of the circuit module according to the third embodiment is the same as in the first embodiment, the same components are identified by the same reference numerals, and their description is omitted.

Although an insulating film is used in the third embodiment, a porcelain enamel board or other suitable insulating material may be used instead of the insulating film.

What is claimed is:
1. A circuit module comprising:
an insulating base including a circuit board having a first wiring pattern;
a sidewall protruding from the circuit board to define a cavity;

a partition wall disposed in the cavity, partitioning the cavity;

at least one first electrical component disposed in the cavity; and, a lid dimensioned to cover the cavity and having a second wiring pattern, wherein the first and second wiring patterns are connected by at least one connecting conductor.

2. A circuit module according to claim 1, further comprising:

at least one second electrical component fixed to the lid, wherein the lid is placed on the sidewall such that the at least one second electrical component is disposed in the cavity.

3. A circuit module according to claim 1, wherein the at least one first electrical component is fixed to the circuit board.

4. The circuit module as in claim 1, wherein the circuit board comprises laminated substrates.

5. The circuit module according to claim 1, wherein the sidewall has at the least one connecting conductor disposed therein.

6. The circuit module as in claim 1, wherein the at least one connecting conductor is disposed on an inside surface of the sidewall.

7. The circuit module according to claim 1, wherein the at least one conductive connection disposed within at least one of the sidewall and the partitioning wall.

8. The circuit module according to claim 1, wherein the at least one of the partitioning wall and the sidewall contains the at least one connecting conductor disposed therein.

9. The circuit module according to claim 1, wherein the lid comprises a multilayer substrate.

10. The circuit module according to claim 9, wherein the multilayer substrate comprises a low-temperature calcined ceramic.

11. The circuit module according to claim 1, wherein the lid has mutually facing electrodes disposed on inner and outer surfaces thereof so as to form a capacitor.

12. The circuit module according to claim 11, wherein the electrode disposed on the outer surface of the lid is accessible to permit trimming to adjust a capacitance of the capacitor.

13. The circuit module of claim 1, wherein an outer surface of at least one of the lid and the insulating base is coated with a metallic layer.

14. The circuit module according to claim 1, wherein the lid comprises a metal plate and an insulating film bonded to the metal plate.

15. The circuit module according to claim 14 wherein the insulating film has the second wiring pattern disposed thereon and at least one second electrical component fixed to the insulating film.

16. The circuit module according to claim 14, wherein the metal plate further comprises bent portions projecting approximately orthogonal to a surface of the metal plate.

17. The circuit module according to claim 16, wherein the lid is placed over the cavity and the bent portions are attached to the sidewall.

18. The circuit module according to claim 17, wherein the bent portions are attached to the sidewall by solder.

19. The circuit module according to claim 17, wherein the bent portions are attached to the sidewall by an adhesive.

20. The circuit module of claim 1, wherein the at least one connecting conductor is a conductive paste.

21. The circuit module according to claim 1, wherein the insulating base comprises a low-temperature calcined ceramic.

22. The circuit module according to claim 1, the sidewall completely surrounds the cavity.

23. The circuit module according to claim 22, wherein the lid is attached to the sidewall such that the cavity is hermetically sealed.

24. The circuit module of claim 1, further comprising lands attached to the second wiring pattern.

25. The circuit module of claim 24, wherein the lands are disposed such that the lands contact the at least one connecting conductor when the lid is placed over the cavity.

26. The circuit module of claim 1, wherein a relief is provided in the sidewall exposing a surface of at least one of the at least one connecting conductor at a lower surface of the insulating base.

27. The circuit module of claim 26, wherein the exposed surface of the connecting conductor comprises a connection to a mother board.

28. The circuit module of claim 1, wherein outer peripheral surfaces of the insulating base and the lid are coated with a metallic layer.

29. The circuit module of claim 28, wherein the metallic coated outer peripheral surfaces form an electrical shield.

30. A circuit module comprising:

an electrically insulating base including a first wiring pattern;

a sidewall protruding from the base so as to define a cavity;

a partition wall disposed in the cavity, partitioning the cavity;

at least one first electrical component disposed in the cavity; and a lid formed so as to cover the cavity and including a second wiring pattern, the lid having at least one second electrical component fixed thereto, wherein the lid is fixed on an upper surface of the sidewall so as to cover the cavity such that the at least one second electrical component is disposed within the cavity, and the first and second wiring patterns are connected to each other with at least one connecting conductor.

31. A method of fabricating a circuit module, comprising:

forming an insulating base having a first circuit pattern;

forming a cavity by forming a sidewall extending orthogonal to the insulating base;

partitioning the cavity by a partition wall disposed in the cavity;

placing at least one first electrical component within the cavity;

forming a tabular lid having a second circuit pattern;

placing at least one second electrical component in contact with the lid;

orienting the lid such that the at least one second electrical component is located within the cavity; and, connecting the first and the second circuit patterns via at least one connecting conductor.

32. The method of claim 31, wherein the at least one connecting conductor is disposed in the sidewall.

33. The method of claim 31, wherein the at least one connecting conductor is a conductive paste.

34. The method of claim 31, wherein the lid has mutually facing electrodes disposed on inner and outer surfaces thereof so as to form a capacitor.

35. The method of claim 31, further comprising coating outer peripheral surfaces of at least one of the lid and the insulating base with a metallic layer.

36. The method of claim 31, further comprises bending portions of the lid such that the portions project approximately orthogonal to the surface of the lid.

37. The method of claim 36, further comprising placing the lid over the cavity and attaching the bent portions to the sidewall.

38. The method of claim 31, further comprising forming the sidewall such that the sidewall completely surrounds the cavity.

39. The method of claim 38, further comprising attaching the sidewall to the lid such that the cavity is hermetically sealed.

40. A circuit module, comprising:
an insulating base;
means for electrically connecting to at least one first electrical component disposed on the insulating base;
means for forming a cavity such that the at least one first electrical component is disposed in the cavity;
means for partitioning the cavity into multiple cavities;
an insulating lid;
means for electrically connecting to at least one second electrical component disposed on the lid;
the insulating lid oriented such that the at least one second electrical component is located within the cavity; and,
means for electrically connecting the insulating base electrical connection means and the insulating lid connecting means.

41. The circuit module of claim 40, further comprising means for shielding the circuit module.

42. The circuit module of claim 40, further comprising means for attaching the insulating lid to the insulating base.

43. The circuit module of claim 40, further comprising means for hermetically sealing the cavity.

44. The circuit module of claim 40, further comprising means for connecting the first electrical component connecting means to a mother board.

45. A circuit module comprising:
an insulating base including a circuit board having a first wiring pattern;
a sidewall protruding from the circuit board to define a cavity;
at least one first electrical component disposed in the cavity; and,
a lid dimensioned to cover the cavity and having a second wiring pattern,
wherein the first and second wiring patterns are connected by at least one connecting conductor, and an outer surface of at least one of the lid and the insulating base is coated with a metallic layer.

46. The circuit module according to claim 45, wherein the lid comprises a metal plate and an insulating film bonded to the metal plate.

47. The circuit module according to claim 46 wherein the insulating film has the second wiring pattern disposed thereon and at least one second electrical component fixed to the insulating film.

48. The circuit module according to claim 46, wherein the metal plate further comprises bent portions projecting approximately orthogonal to a surface of the metal plate.

49. The circuit module according to claim 48, wherein the lid is placed over the cavity and the bent portions are attached to the sidewall.

50. The circuit module according to claim 49, wherein the bent portions are attached to the sidewall by solder.

51. The circuit module according to claim 49, wherein the bent portions are attached to the sidewall by an adhesive.

52. The circuit module of claim 45, wherein the at least one connecting conductor is a conductive paste.

53. The circuit module according to claim 45, wherein the insulating base comprises a low-temperature calcined ceramic.

54. The circuit module according to claim 45, wherein the sidewall completely surrounds the cavity.

55. The circuit module according to claim 54, wherein the lid is attached to the sidewall such that the cavity is hermetically sealed.

56. The circuit module of claim 45, further comprising lands attached to the second wiring pattern.

57. The circuit module of claim 56, wherein the lands are disposed such that the lands contact the at least one connecting conductor when the lid is placed over the cavity.

58. The circuit module of claim 45, wherein a relief is provided in the sidewall exposing a surface of at least one of the at least one connecting conductor at a lower surface of the insulating base.

59. The circuit module of claim 58, wherein the exposed surface of the connecting conductor comprises a connection to a mother board.

60. The circuit module of claim 45, wherein outer peripheral surfaces of the insulating base and the lid are coated with a metallic layer.

61. The circuit module of claim 60, wherein the metallic coated outer peripheral surfaces form an electrical shield.

62. A method of fabricating a circuit module, comprising:
forming an insulating base having a first circuit pattern;
forming a cavity by forming a sidewall extending orthogonal to the insulating base;
placing at least one first electrical component within the cavity;
forming a tabular lid having a second circuit pattern;
placing at least one second electrical component in contact with the lid;
coating outer peripheral surfaces of at least one of the lid and the insulating base with a metallic layer;
orienting the lid such that the at least one second electrical component is located within the cavity; and,
connecting the first and the second circuit patterns via at least one connecting conductor.

63. The method of claim 62, wherein the at least one connecting conductor is disposed in the sidewall.

64. The method of claim 62, wherein the at least one connecting conductor is a conductive paste.

65. The method of claim 62, wherein the lid has mutually facing electrodes disposed on inner and outer surfaces thereof so as to form a capacitor.

66. The method of claim 62, further comprises bending portions of the lid such that the portions project approximately orthogonal to the surface of the lid.

67. The method of claim 62, further comprising placing the lid over the cavity and attaching the bent portions to the sidewall.

68. The method of claim 62, further comprising forming the sidewall such that the sidewall completely surrounds the cavity.

69. The method of claim 62, further comprising attaching the sidewall to the lid such that the cavity is hermetically sealed.

* * * * *

UNITED STATES PATENT AND TRADEMARK OFFICE
CERTIFICATE OF CORRECTION

PATENT NO. : 6,884,938 B2  Page 1 of 1
APPLICATION NO. : 10/706064
DATED : April 26, 2005
INVENTOR(S) : Toru Aoyagi It is certified that error appears in the above-identified patent and that said Letters Patent is hereby corrected as shown below:

In the Claims

Column 6, in claim 22, line 1, before "the sidewall" insert --wherein--.

Signed and Sealed this

Twenty-eighth Day of November, 2006

JON W. DUDAS
*Director of the United States Patent and Trademark Office*